United States Patent
Barbier et al.

(10) Patent No.: US 8,153,947 B2
(45) Date of Patent: Apr. 10, 2012

(54) PIXEL CIRCUIT FOR GLOBAL ELECTRONIC SHUTTER

(75) Inventors: Frédéric Barbier, Grenoble (FR); Yvon Cazaux, Grenoble (FR)

(73) Assignee: STMicroelectronics S.A., Montrouge (FR)

( * ) Notice: Subject to any disclaimer, the term of this patent is extended or adjusted under 35 U.S.C. 154(b) by 463 days.

(21) Appl. No.: 12/350,677

(22) Filed: Jan. 8, 2009

(65) Prior Publication Data
US 2009/0200454 A1 Aug. 13, 2009

(30) Foreign Application Priority Data

Jan. 10, 2008 (EP) .................................... 08300022

(51) Int. Cl.
*H01L 27/00* (2006.01)
(52) U.S. Cl. ................................................ 250/208.1
(58) Field of Classification Search ............... 250/208.1, 250/214.1
See application file for complete search history.

(56) References Cited

U.S. PATENT DOCUMENTS

| 6,825,878 B1* | 11/2004 | Rhodes .................. 348/308 |
| 6,933,488 B2* | 8/2005 | Pain ...................... 250/214.1 |
| 2003/0076431 A1* | 4/2003 | Krymski ................ 348/308 |
| 2004/0036010 A1* | 2/2004 | Hsieh et al. .......... 250/208.1 |

FOREIGN PATENT DOCUMENTS
EP 1 732 134 A 12/2006

OTHER PUBLICATIONS

European Search Report dated Jun. 11, 2008 from European Patent Application No. EP 08 30 0022.

* cited by examiner

*Primary Examiner* — Georgia Y Epps
*Assistant Examiner* — Renee Naphas
(74) *Attorney, Agent, or Firm* — Wolf, Greenfield & Sacks, P.C.

(57) ABSTRACT

An image sensor formed of an array of pixels, each pixel including a photodiode coupled between a first reference voltage and a first switch, the first switch being operable to connect the photodiode to a first node; a capacitor arranged to store a charge accumulated by the photodiode, the capacitor being coupled between a second reference voltage and a second node; a second switch coupled between the first and second nodes, the second switch being operable to connect the capacitor to the first node; and read circuitry coupled for reading the voltage at the second node.

19 Claims, 4 Drawing Sheets

_US 8,153,947 B2_

PIXEL CIRCUIT FOR GLOBAL ELECTRONIC SHUTTER

CROSS REFERENCE TO RELATED APPLICATIONS

This application claims the priority benefit of European patent application number 08300022.4, filed on Jan. 10, 2008, entitled "PIXEL CIRCUIT FOR GLOBAL ELECTRONIC SHUTTER" which is hereby incorporated by reference to the maximum extent allowable by law.

BACKGROUND OF THE INVENTION

1. Field of the Invention

The present invention relates to pixel circuitry for an image sensor and in particular to pixel circuitry for an image sensor having a global shutter mode.

2. Discussion of the Related Art

FIG. 1 illustrates a pixel circuit 100 suitable for operation in a global shutter mode. Circuit 100 comprises a pinned photodiode 102 coupled between ground and a node 104. "Pinned" means that the photodiode is initially at a fixed voltage, such as 0 V, before an accumulation of charge. Node 104 is coupled to a power supply voltage VRT via an overflow transistor 106 controlled by an overflow signal OF, and to a storage node 108 via a transfer gate transistor 110, controlled by a signal TG. Node 108 is further coupled to the supply voltage VRT via a reset transistor 112 controlled by reset signal RST, and to the gate node of a sense transistor 114. Transistor 114 has one of its source/drain nodes coupled to the supply voltage VRT, and its other source/drain node coupled to a pixel line 116 via a read transistor 118 controlled by a signal READ.

Operation of pixel 100 in a global shutter mode will now be described with reference to the timing diagram of FIG. 2.

FIG. 2 shows timing diagrams for signals OF, DATA, TG, READ and RST, applied to the pixels in three adjacent rows in an image sensor n, n+1 and n+2.

Initially, signal OF comprises a pulse and the falling edge of this signal initiates a start of an integration period $t_i$ of the pixels in the image sensor. Towards the end of the integration period $t_i$, node 108 of each pixel in the image sensor is reset by applying a short pulse to the gate of reset transistor 112. Next, during a transfer period $T_R$, the signal TG to the transistors 110 of each pixel is asserted high for a short duration, to transfer charge accumulated by a photodiode during the integration period to node 108, and TG is brought low to end the integration period $t_i$.

The signal at node 108 in each pixel in the image sensor is stored until the corresponding row is read. Rows are read consecutively, and in this example the first row to be read is row n. For this, the signal READ applied to pixels in row n is asserted, connecting node 108 to column line 116, and the voltage on line 116 is sampled by sampling circuitry (not shown), as indicated by arrow $L_n$. Node 108 is then reset by applying RST for a short pulse, and then a reference value is sampled by the sampling circuitry, as indicated by the arrow $L_{REFn}$. The read pulse then returns low, and the signals captured by the is sampling circuitry at $L_n$ and $L_{REFn}$ are converted into digital format and output as indicated by the DATA signal. Rows n+1 and n+2 are then read one after the other in the same manner.

A problem with the circuit of FIG. 1, and the method described in relation to FIG. 2, is that there is a large delay between the end of the global integration period $t_i$, and the read-out of the last rows that are read during which the image signal stored at node 108 becomes degraded in quality. For example, assuming that the read out of one row of 3000 pixels takes approximately 75 µs, when there are over 2000 rows, the delay before the first row is read may be only 30 µs, whereas the delay before the last row can be 75 ms or more. During this delay, crosstalk between the photodiode and the storage node 108 can add to the signal stored on node 108, and furthermore current leakage from node 108, known as dark current, can cause the signal at node 108 to deteriorate. Such interference is undesirable as it can result in a degrading of the image quality between the first and last pixels to be read.

SUMMARY OF THE INVENTION

Embodiments of the present invention aim to at least partially address one or more problems in the prior art.

According to an aspect of the present invention, there is provided an image sensor comprising an array of pixels, each pixel comprising: a photodiode coupled between a first reference voltage and a first switch, the first switch operable to connect the photodiode to a first node; a capacitor arranged to store a charge accumulated by the photodiode, the capacitor being coupled between a second reference voltage and a second node; a second switch coupled between the first and second nodes, the second switch being operable to connect the capacitor to the first node; and read circuitry coupled for reading the voltage at the second node.

According to an embodiment of the present invention, the read circuitry is connected to the first node, and the image sensor comprises control circuitry arranged to control the first and second switches in each pixel to transfer a charge accumulated by the photodiode to the capacitor at the end of an integration period of the image sensor, and to control, in a row of pixels, the second switch to connect the capacitor to the first node when the row of pixels is to be read.

According to another embodiment of the present invention, the photodiode is formed in a first P-type region and the second switch comprises a first transistor formed in a second P-type region, the first and second P-type regions having different doping levels.

According to another embodiment of the present invention, each pixel comprises a light shield formed over the second switch and the first node.

According to another embodiment of the present invention, the read circuitry comprises a second transistor having its gate node connected to the first node.

Preferably, the first and second reference voltages are different.

According to another aspect of the present invention, there is provided a digital camera and/or a mobile telephone comprising the above image sensor, a display for displaying images captured by the image sensor and a memory for storing images captured by the image sensor.

According to another aspect of the present invention, there is provided a method of operating an image sensor comprising an array of pixels, each pixel comprising a photodiode, a first node connectable to the photodiode by a first transistor, and a capacitor connectable to the first node by a second transistor, the capacitor arranged to store a charge accumulated by the photodiode, the method comprising: accumulating charges by the photodiodes during an integration period; at the end of the integration period, controlling the first and second transistors to transfer the charges to the capacitors; and reading pixel voltages from a row of the pixels by reading the voltages stored by the capacitors in the row.

According to an embodiment of the present invention, the method further comprises reading reference voltages from a row of the pixels by resetting the capacitors in the row, and reading the voltage on the capacitors.

According to another embodiment of the present invention, the pixels of the image sensor are controlled to have a common integration period ending at the same time, and wherein rows of the pixels are read sequentially.

Preferably, said pixel voltages and reference voltages are read by connecting said capacitors to said first nodes to transfer charges to said first nodes and then by reading the voltages at said first nodes.

BRIEF DESCRIPTION OF THE DRAWINGS

The foregoing and other purposes, features, aspects and advantages of the invention will become apparent from the following detailed description of embodiments, given by way of illustration and not limitation with reference to the accompanying drawings, in which.

DETAILED DESCRIPTION

Figure 1:
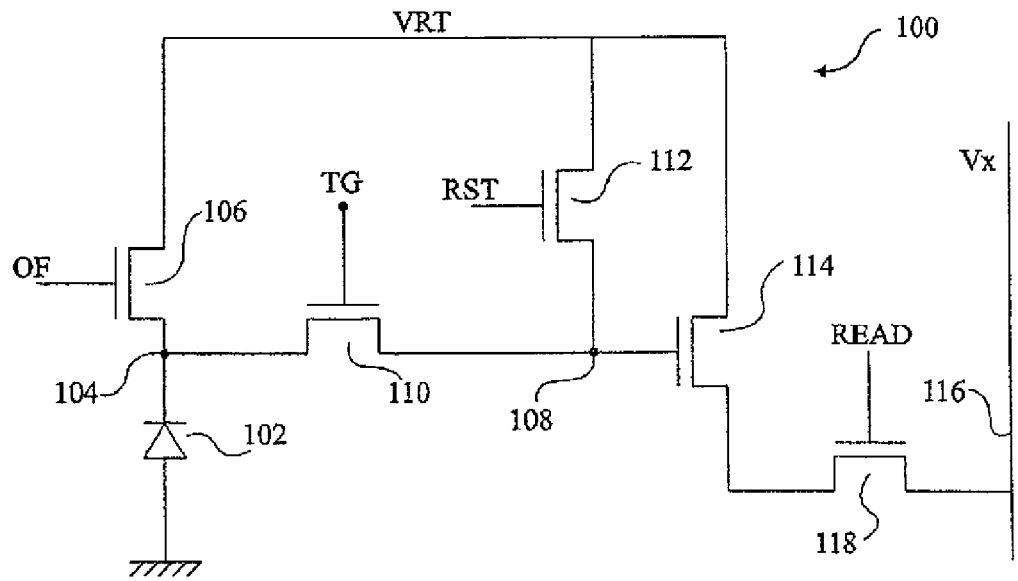
FIG. 1 (described above) illustrates a pixel of an image sensor having a global shutter mode.
Figure 2:
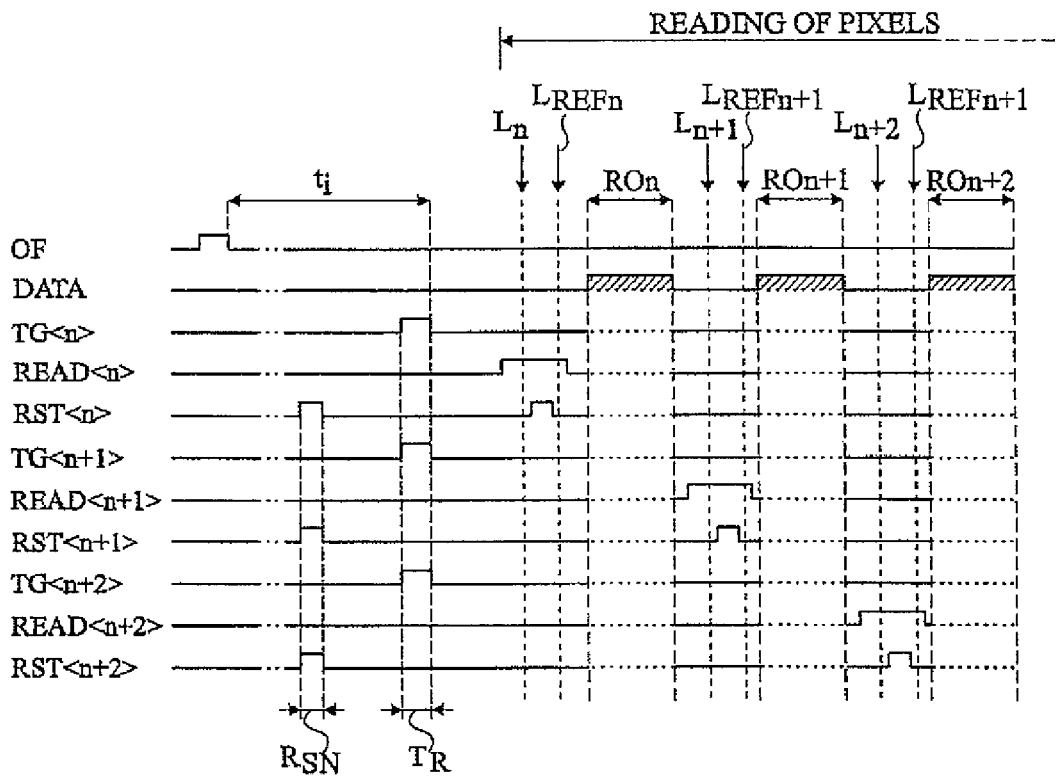
FIG. 2 (described above) illustrates timing signals applied to transistors in an array of pixels.
Figure 3:
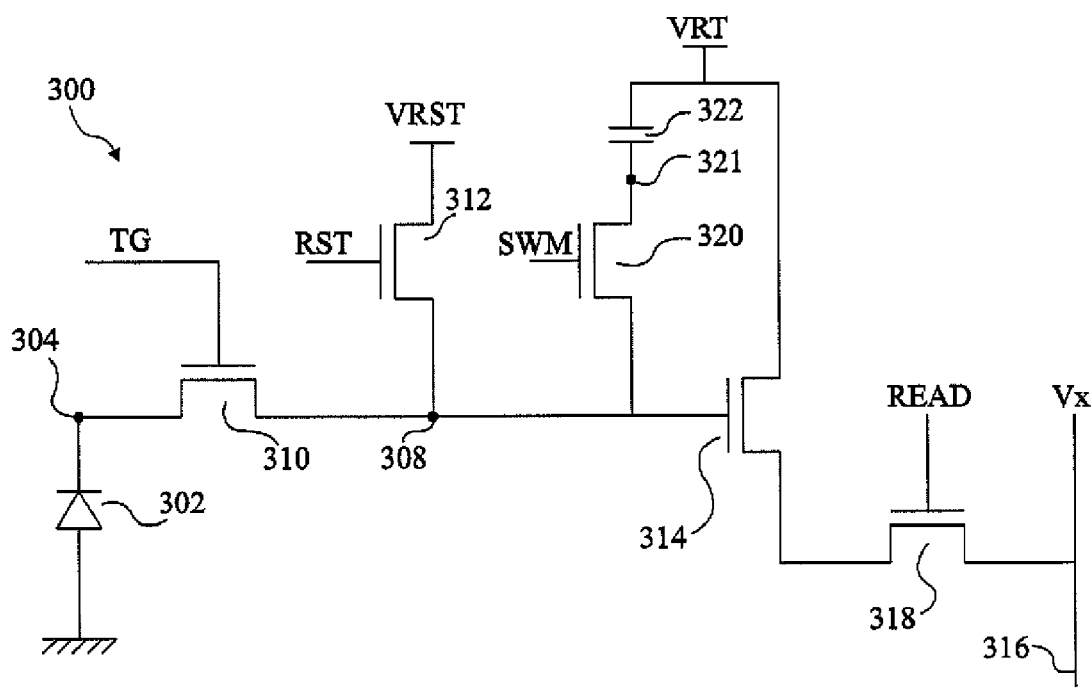
FIG. 3 illustrates a pixel circuit according to an embodiment of the present invention.

FIG. 3 illustrates a pixel circuit 300 comprising a pinned photodiode 302 coupled between ground and a node 304, node 304 being coupled to a first source/drain node of a MOS transistor 310. The other source/drain node of MOS transistor 310 is coupled to a node 308, which is in turn coupled to a reset voltage VRST via a reset transistor 312, controlled by a reset signal RST, and to the gate terminal of a sense transistor 314. Transistor 314 is a MOS transistor having one of its source/drain nodes coupled to a supply voltage VRT, and its other source/drain node coupled to a column line 316 via an optional read transistor 318, controlled by a signal READ at its gate node.

Node 308 is also coupled to a first source/drain node of a MOS transistor 320, the other source/drain node of MOS transistor 320 being coupled to a storage node 321. A capacitor 322 is coupled between node 321 and the supply voltage VRT. In alternative embodiments, capacitor 322 could be coupled to a different voltage such as a ground voltage, however, to reduce cross-talk in such an embodiment, the capacitor is preferably not connected to the substrate, but to a different ground connection.

Capacitor 322 allows the signal transferred from the photodiode 302 at the end of the integration period to be stored with much less risk of deterioration than if it were stored at node 308. Capacitor 322 is for example a metal insulator metal (MIM) capacitor, or a polysilicon insulator polysilicon capacitor.

In alternative embodiments, rather than being coupled to the supply voltage VRT, capacitor 322 could be coupled to VRST. This can be advantageous as while no current is drawn by capacitor 322 and reset transistor 312, a current is drawn by sense transistor 314 when the voltage at node 308 is read. Alternatively, VRST and VRT could be combined to form the same voltage node.

In alternative embodiments, read transistor 318 could be omitted. In such embodiments, the supply voltage VRT is, for example, a constant voltage, while the voltage VRST is a pulsed voltage used to control when the voltage at node 308 is to be read, instead of the read signal.

Figure 4:
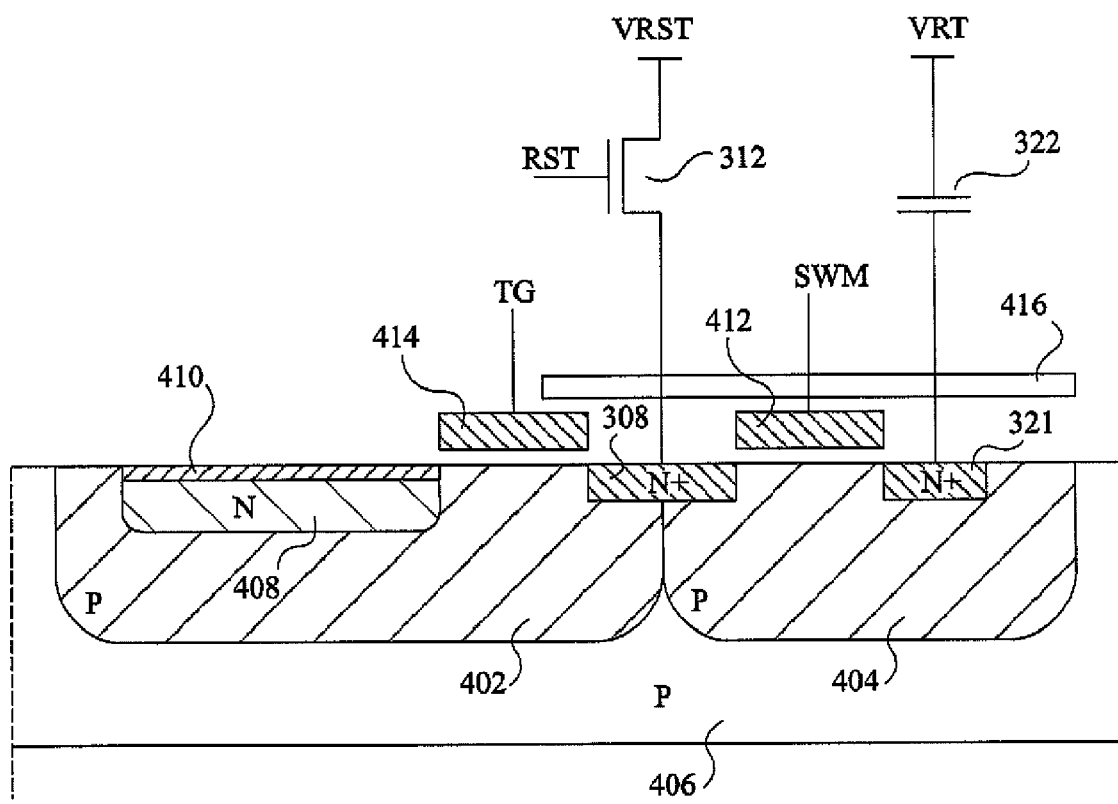
FIG. 4 is a cross-section illustrating the structure of parts of the pixel circuit of FIG. 3 in more detail according to an embodiment of the present invention.

FIG. 4 illustrates schematically, in cross-section, part of a silicon structure comprising photodiode 302, transistor 310, and transistor 320 of FIG. 3.

The silicon structure comprises P-wells 402 and 404 formed in an epitaxial P-type layer 406. An N type doped region 408 is formed close to an upper surface in p-well 402 providing a PN junction which forms the photodiode 302. An P+ type doped layer 410 is formed over the N type region 408, which performs the roles of ensuring that the photodiode is fully depleted, and neutralizing dark current. An N+ type doped region is formed at the junction between the P-wells 402 and 404, and forms node 308, coupled to the reset voltage via reset transistor 312, and to the sense transistor 314 (not shown in FIG. 4). An N-type doped region is formed at the surface of P-well 404, forming the source/drain node 321 of MOS transistor 320, coupled to capacitor 322. Capacitor 322 is, for example, formed in one or more metal layers formed over the silicon device. A gate stack 412 is formed over P-well 404 between the N-type doped regions 308 and 321, this gate stack forming the gate node of transistor 320. The gate for example comprises metal and oxide layers, or alternatively layers of silicide, or other materials.

A gate stack 414 is formed over P-well 402 between the N type doped region 308 and N type doped region 408. This gate stack forms the gate of transistor 310 and for example comprises metal and oxide layers, or alternatively layers of silicide, or other materials.

A light shield 416 is formed covering P-well 404, the N type doped region 308, and overlapping parts of the gate structure 414. The light shield is, for example, made from an opaque material such as a metal, for example aluminum or copper, or a dark resin. The light shield 416 is designed to prevent photons entering P-well 404, and adding noise to voltages at node 308 or node 321.

In order to limit current leakage, the surface areas of the N-type active region of node 308 and of the drain node 321 of transistor 320 are preferably made as small as possible, which is the smallest area needed to make the source/drain contact. The particular dimensions that can be achieved will depend on the technology Furthermore, separate P-wells 402 and 404 are provided that have different doping levels, thus helping to reduce crosstalk between the P-well 402 containing the photodiode and P-well 404. Preferably, the P-type epitaxial layer 406 has a relatively low doping, P-well 402 has a doping level slightly higher than layer 406, and P-well 404, for example, has a normal doping level which is higher than P-well 402 and P-type region 406.

Figure 5:
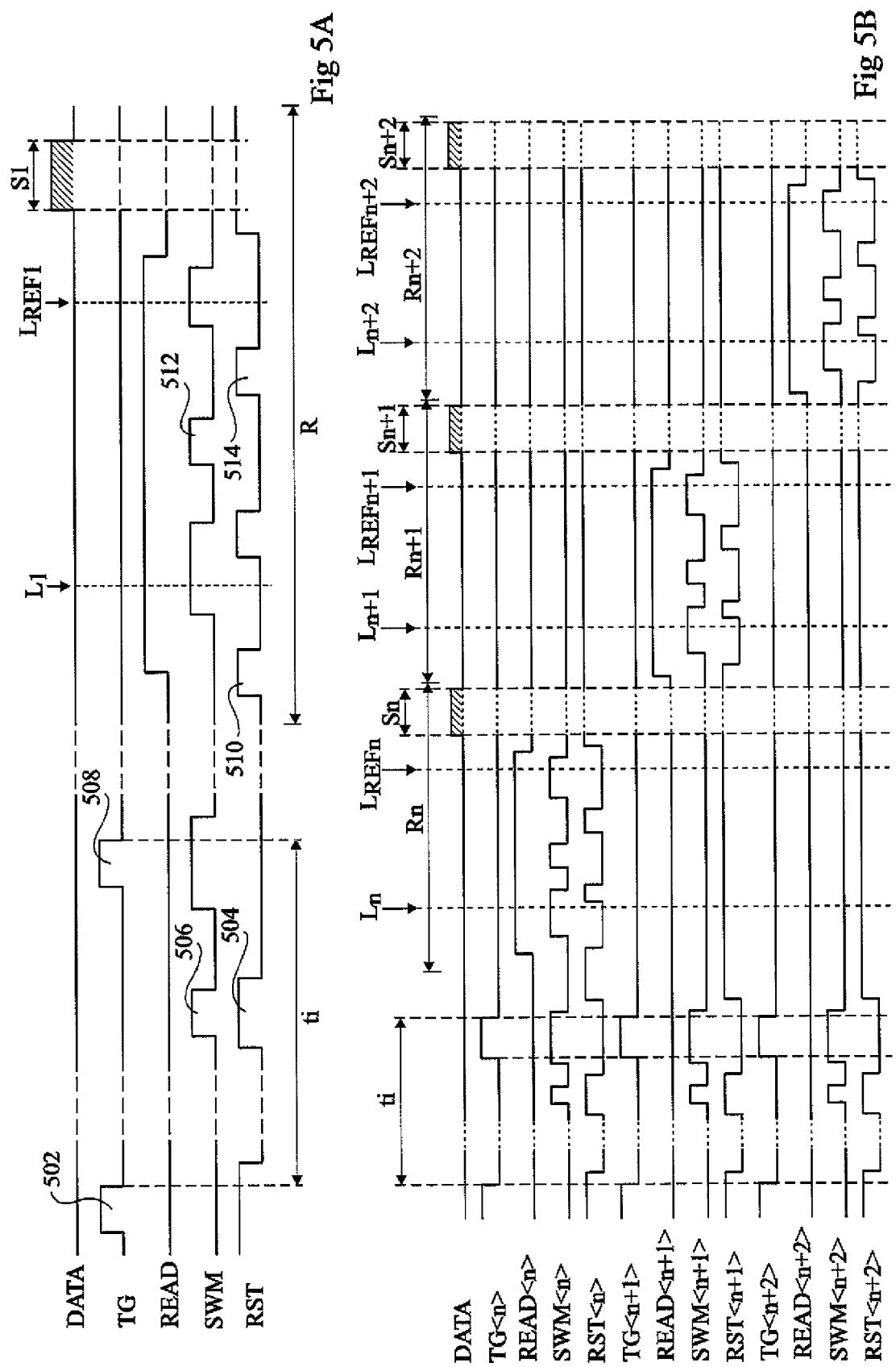
FIG. 5A shows timing diagrams for signals applied to a row of pixels according to an embodiment of the present invention.
FIG. 5B shows timing signals applied to three adjacent rows of pixels of an image sensor according to embodiments of the present invention.

FIG. 5A shows timing signals relating to operation of one row of pixels an image sensor, the pixels comprising pixel circuit 300 of FIG. 3. Signal DATA represents the period in which voltages captured from the row of pixels is digitized and output as pixel data. Also illustrated are signals TG applied to a gate of transistor 310, READ applied to the gate of transistor 318, SWM applied to gate of transistor 320, and RST applied to the gate of the reset transistor 312.

Initially, the reset signal RST is applied, connecting nodes 308 in the row of pixels to a reset voltage VRST. A pulse 502 is then applied to TG, to connect node 304 to storage node 308, and thus also to VRST. This has the effect of draining any charges stored by the photodiode 302 to the supply voltage, and resetting the photodiode to its natural potential, for example equal to approximately 1.5 volts. The failing edge of pulse 502 starts integration period $t_i$ of the row of pixels, which is the same for all the rows of the image sensor. Once the integration period has started, signal RST is brought low.

The reset signal comprises a pulse 504 towards the end of the integration period $t_i$, to reset the voltage at node 308. During pulse 504, while RST is asserted, a pulse 506 is applied to signal SWM to turn on transistor 320, connecting capacitor 322 to node 308. This has the effect of resetting the voltage stored by capacitor 322. SWM and then RST are then brought low. The charge accumulated during integration period by photodiode 302 is transferred to capacitor 322 by asserting signal SWM, and applying a pulse 508 to TG. The integration period ends on the falling edge of pulse 508. SWM is then returned low, isolating the capacitor from node 308.

To read the voltage from capacitor 322, a read sequence R is performed. This may occur soon after the end of the integration period, or much later, depending on which row in the image sensor is to be read. The read sequence in this example comprises applying a pulse 510 to the reset signal RST, to reset the voltage at node 308, and during the reset pulse 510, applying the READ signal. Signal SWM is then asserted, connecting capacitor 322 to node 308, such that this voltage can be read via the sense transistor 314, read transistor 318 and column line 316. As indicated by arrow L1 the voltage on column line 316 is then sampled by sampling circuitry.

A reference voltage is then read to allow the voltage change at node 308 to be determined. For this, the sequence of signals applied for transferring and reading the pixel voltage are repeated. Firstly, RST is applied while SWM is still asserted, which resets the voltage at node 308, and at capacitor 322. SWM and then RST are then brought low again. A pulse 512 is then applied to SWM, to transfer the reference voltage at node 308 to capacitor 322, and once SWM is returned low, a further reset pulse 514 is applied to reset the voltage at node 308. Signal SWM is then asserted, connecting capacitor 322 to node 308, and the voltage on pixel line 316 is sampled as indicated by arrow $L_{REF1}$. SWM is then brought low, the read signal is brought low, and reset is applied.

The values sampled at L1 and $L_{REF1}$ are stored by capacitors in sample circuitry not shown in FIG. 3. The difference between these values is digitized, and as illustrated in FIG. 5A, and output as data during a period $S_1$.

FIG. 5B illustrates timing signals applied to three different adjacent rows of pixel circuits n, n+1 and n+2. In practice, an image sensor could comprise a large number of rows, for example several thousand.

As illustrated, during the integration period $t_i$, the same signals TG, SWM and RST are applied in all of the pixels in all of the rows of the image sensor, resulting in a global integration period. The read sequence for row n is then performed, labelled $R_n$, and signals Ln and $L_{REFn}$ are sampled. These values are digitized and output as data during period Sn. Once this read sequence has finished, the read sequence for row n+1 is performed, labelled $R_{n+1}$, followed by the read sequence for row n+2, labelled $R_{n+2}$.

Figure 6:
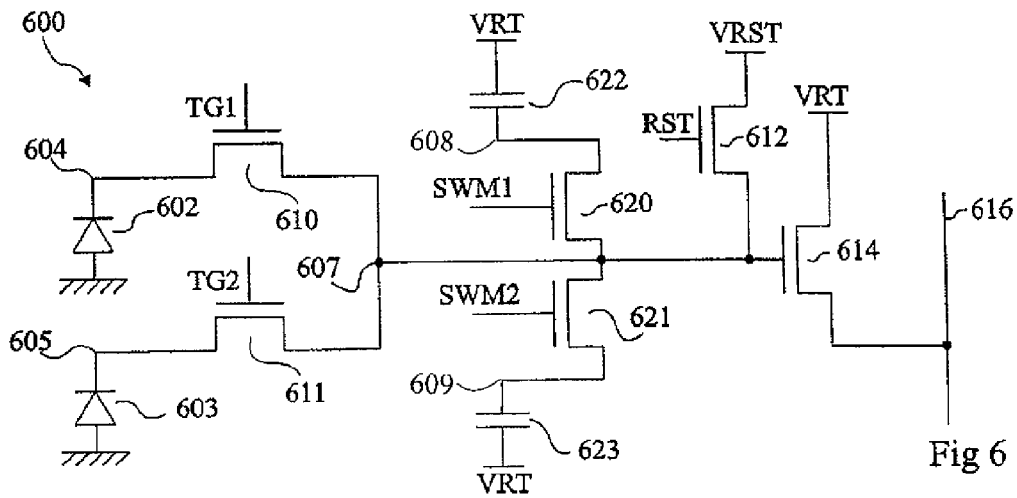
FIG. 6 illustrates a pixel circuit according to an alternative embodiment of the present invention.

FIG. 6 illustrates an alternative pixel circuit 600, which is a 3T structure comprising two photodiodes and six MOS transistors.

Pixel circuit 600 comprises a photodiode 602 coupled between ground and a node 604, and a photodiode 603 coupled between ground and a node 605. Node 604 is coupled to node 607 via a transistor 610, while node 605 is also coupled to node 607 via a transistor 611. Node 607 is further coupled to one terminal of a capacitor 622 via a transistor 620 controlled by a signal SWM1. The other terminal of capacitor 622 is connected to the supply voltage VRT, and to the gate node of a sense transistor 614. In a similar fashion, node 607 is further coupled to one terminal of a capacitor 623 via a transistor 621 controlled by a signal SWM2. The other terminal of capacitor 623 is coupled to the supply voltage VRT. Node 607 is further coupled to a reset voltage VRST via a reset transistor 612 controlled by signal RST.

Operation of circuit 600 is similar to that of circuit 300, and in particular signals TG1 and TG2 control the start and end of a global integration period $t_i$, although they are slightly offset with respect to each other, the charge of one photodiode being transferred to one capacitor slightly before transfer of the charge of the other photodiode. The accumulated charge associated with photodiodes 602, 603 are stored by capacitors 622 and 623 respectively at nodes 608 and 609, using transistors 620 and 621 controlled by asserting signals SWM1 and SWM2 respectively. Reading the signals from capacitors 620 and 621 is also slightly offset in time from each other, and SWM1 is asserted to allow the charge from capacitor 622 associated with the pixel voltage and reference voltage to be transferred to node 607 and read, and SWM2 is asserted to allow the charge from capacitor 623 associated with the pixel voltage and reference voltage to be transferred to node 607 and read.

Figure 7:
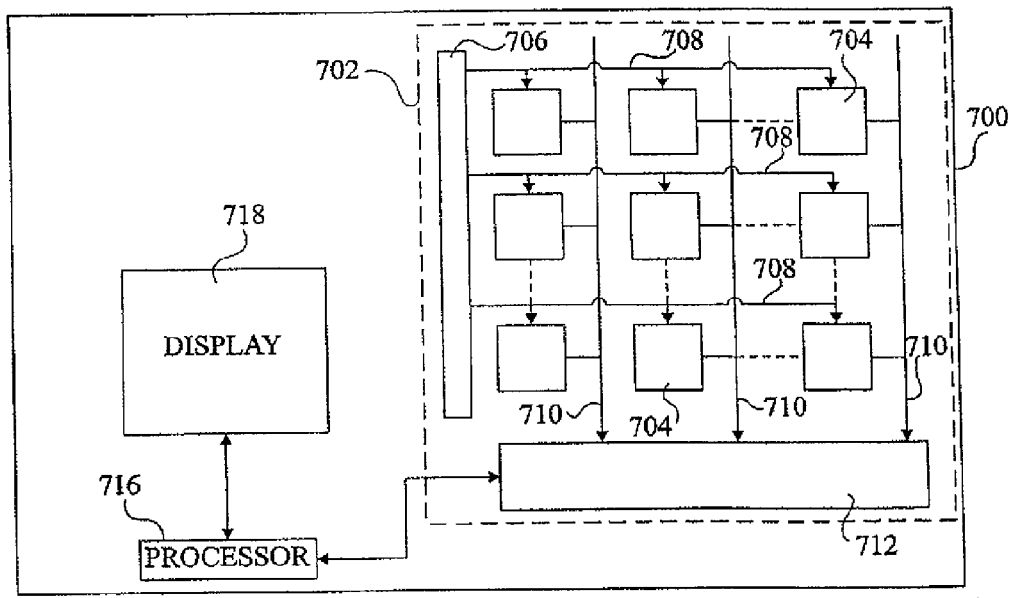
FIG. 7 illustrates a device 700 comprising an image sensor according to an embodiment of the present invention.

FIG. 7 illustrates a device 700 comprising an image sensor 702 comprising an array of pixels 704, each for example comprising the pixel circuit 300 of FIG. 3 or pixel circuit 600 of FIG. 6. Rows of pixels 704 are coupled to row control circuitry 706 via row lines 708. Three rows of pixels and corresponding row lines are illustrated, although many more rows could be provided. Row control circuitry 706 provides the signals TG, RST, SWM and READ to each pixel.

Columns of pixels 704 are coupled to column lines 710, which are coupled to output circuitry 712. Three columns of pixels and corresponding column lines are illustrated, although many more may be provided. Output circuitry 712 comprises sampling circuitry for sampling values from selected rows of pixels.

A processor 716 is coupled to the output circuitry 712, and also to a display 718. Pixel values output by the image sensor 702 are for example displayed by display 718, and may be stored by a memory (not shown in FIG. 7).

Device 700 is, for example, a mobile telephone, digital camera, PDA (personal digital assistant) or the like.

Figure 8:
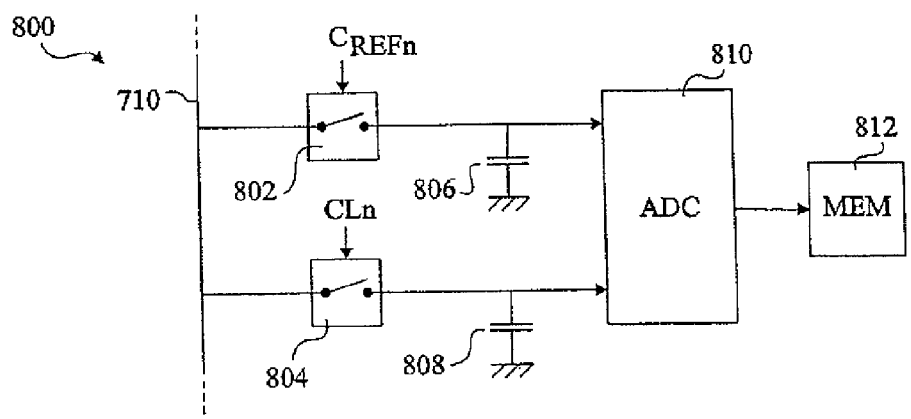
FIG. 8 illustrates sampling circuitry of FIG. 7 in more detail.

FIG. 8 illustrates circuitry 800 forming part of the sampling circuitry 712 of the device 700.

A column line 710 is coupled to a first sampling switch 802 and a second sampling switch 804. Switch 802 is coupled to a grounded capacitor 806 and switch 804 is coupled to a grounded capacitor 808. Capacitors 806 and 808 are further coupled to an analog-to-digital converter (ADC) 810. The output of ADC 810 is coupled to a memory 812.

A sampling signal $C_{REFn}$ is applied to control switch 802 to connect column line 810 to capacitor 806 at $L_{REFn}$, such that the reference value is stored by capacitor 806. Similarly, a sampling signal $C_{Ln}$ is applied to switch 804 to control switch to connect column line 710 to capacitor 808 at Ln, such that the pixel voltage is stored by capacitor 808.

The values stored by capacitors 806 and 808 are sampled by ADC 810, and the difference between these values is digitized and output as the pixel data to be stored in memory 812. Circuitry similar to circuitry 800 is provided associated with each column line of the image sensor, such that a row of digital is pixel values is output at the end of each read sequence.

An advantage of embodiments of the present invention is that the pixel voltage in the pixel circuit can be stored by the capacitor with very low noise caused by cross-talk or current leakage.

A further advantage is that noise, for example fixed pattern noise, can be kept low by using a reference voltage read under the same conditions as the pixel data.

Having thus described at least one illustrative embodiment of the invention, various alterations, modifications and improvements will readily occur to those skilled in the art.

For example, while circuits have been described comprising MOS transistors, one or more of these could be replaced by other types of transistors such as bipolar transistors. Furthermore, while a 5T structure (FIG. 3) and a 3T structure (FIG. 6) have been described, in alternative embodiments these circuits could be adapted with fewer or additional photodiodes, capacitors and transistors, to provide different structures having a different number of transistors per photodiode. It will be apparent that while examples of the timing of control signals have been provided, many modifications can be made, while keeping the advantages of the invention.

Furthermore, while embodiments of pixels have been described as operating in a global shutter mode of operations, they could additionally operate in a rolling shutter mode. In this case, a different sequence of control signals could be used, and given the much shorter delay time between transfer and read, storing charges on the capacitor is optional.

Furthermore, while in the described embodiments the sense transistor is connected to the first node, in alternative embodiments the gate node of the sense transistor 314 could be connected directly to node 321, rather than to node 308. In this case, a different sequence of control signals can be provided to read the voltages and read a reference. In particular, the sense transistor can be connected to VRST rather than VRT, and VRST can be used to select the pixel for reading, as a type of read signal. Whereas the READ signal for example has low and high values of 0 V and 3.5 V, VRST for example has values of 1 and 2.7 V.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. An image sensor comprising an array of pixels, each pixel comprising:
   a photodiode coupled between a first reference voltage and a first switch, said first switch operable to connect said photodiode to a first node;
   a capacitor arranged to store a charge accumulated by said photodiode, said capacitor being coupled between a second reference voltage and a second node;
   a second switch coupled between said first and second nodes, said second switch being operable to connect said capacitor to said first node; and
   read circuitry connected to said first node for reading the voltage at said second node, the image sensor further comprising control circuitry arranged to control said first and second switches in each pixel to transfer a charge accumulated by said photodiode to said capacitor at the end of an integration period of said image sensor, and to control, in a row of pixels, the second switch to connect said capacitor to said first node when said row of pixels is to be read, wherein said photodiode is formed in a first P-type well and said second switch comprises a first transistor formed in a second P-type well, said first and second P-type wells having different doping levels, and wherein an N+ type region formed at a junction of said first and second P-type wells serves as said first node.

2. The image sensor of claim 1, wherein, before the end of the integration period, the control circuitry is arranged to control said second switch to couple said first node to said capacitor, and while said first node is coupled to said capacitor by said second switch, to control said first switch to transfer said charge to said capacitor.

3. The image sensor of claim 1, wherein each pixel comprises a light shield formed over said second switch and said first node.

4. The image sensor of claim 1, wherein said read circuitry comprises a sense transistor having its gate node connected to said first node.

5. A digital camera comprising the image sensor of claim 1, a display for displaying images captured by said image sensor and a memory for storing images captured by said image sensor.

6. A mobile telephone comprising the image sensor of claim 1, a display for displaying images captured by said image sensor and a memory for storing images captured by said image sensor.

7. A method of operating an image sensor comprising an array of pixels, each pixel comprising a photodiode, a first node connectable to said photodiode by a first transistor, and a capacitor connectable to said first node by a second transistor, said capacitor arranged to store a charge accumulated by said photodiode, the method comprising:
   accumulating charges by said photodiodes during an integration period;
   at the end of said integration period, controlling said first and second transistors to transfer said charges to said capacitors; and
   reading pixel voltages from a row of said pixels by reading the voltages stored by said capacitors in said row, wherein said photodiode is formed in a first P-type well and said second transistor is formed in a second P-type well, said first and second P-type wells having different doping levels, and wherein an N+ type region formed at a junction of said first and second P-type wells serves as said first node.

8. The method of claim 7, comprising, before the end of said integration period, controlling said second transistor to connect said capacitor to said first node, wherein at the end of said integration period said charge is transferred to said capacitors by controlling said first switch, while the first node is connected to the capacitor, to connect the photodiode to the first node.

9. The method of claim 7, further comprising reading reference voltages from a row of said pixels by resetting the capacitors in said row, and reading the voltage on said capacitors.

10. The method of claim 7, wherein the pixels of said image sensor are controlled to have a common integration period ending at the same time, and wherein rows of said pixels are read sequentially.

11. An image sensor comprising an array of pixels, each pixel comprising:
 a photodiode coupled between a first reference voltage and a first transistor, the first transistor configured to connect the photodiode to a first node, the photodiode being formed in a first P-type well;
 a capacitor configured to store a charge accumulated by the photodiode, the capacitor being coupled between a second reference voltage and a second node;
 a second transistor coupled between the first and second nodes, the second transistor configured to connect the capacitor to the first node, the second transistor being formed in a second P-type well, wherein an N+ type region formed at a junction of the first and second P type wells serves as the first node;
 read circuitry coupled to the first node, the read circuitry configured to read a voltage at the second node; and
 control circuitry configured to control the first and second transistors to transfer a charge accumulated by the photodiode to the capacitor at an end of an integration period and to connect the capacitor to the first node when the pixel is to be read.

12. An image sensor as defined in claim 11, wherein the first transistor is formed in the first P-type well.

13. An image sensor as defined in claim 11, wherein the first and second P type wells have different doping levels.

14. An image sensor as defined in claim 11, wherein the first and second P type wells are formed in an epitaxial P-type layer.

15. An image sensor as defined in claim 11, further comprising a light shield formed over at least the second P-type well.

16. An image sensor as defined in claim 11, wherein, before the end of the integration period, the control circuitry is configured to control the second transistor to couple the first node to the capacitor, and while the first node is coupled to the capacitor by the second transistor, to control the first transistor to transfer the charge to the capacitor.

17. A method of manufacturing an image sensor comprising an array of pixels, each pixel including a photodiode, a node connected to the photodiode through a first transistor, and a second transistor connectable to a capacitor, comprising:
 forming the photodiode and the first transistor in a first P type well;
 forming the second transistor in a second P type well; and
 forming an N+ type region at a junction between the first and second P type wells, the N+ type region serving as the node.

18. A method as defined in claim 17, wherein the first and second P type wells have different doping levels.

19. A method as defined in claim 17, wherein the first and second P type wells are formed in a epitaxial P type layer.

* * * * *

UNITED STATES PATENT AND TRADEMARK OFFICE
CERTIFICATE OF CORRECTION

PATENT NO. : 8,153,947 B2
APPLICATION NO. : 12/350677
DATED : April 10, 2012
INVENTOR(S) : Frédéric Barbier et al.

Page 1 of 1

It is certified that error appears in the above-identified patent and that said Letters Patent is hereby corrected as shown below:

Col. 5, line 10, should read:
example equal to approximately 1.5 volts. The falling edge of Signed and Sealed this
Fifteenth Day of May, 2012

David J. Kappos
*Director of the United States Patent and Trademark Office*